United States Patent
Belt et al.

(10) Patent No.: US 7,146,012 B1
(45) Date of Patent: *Dec. 5, 2006

(54) AUDIO PROCESSING ARRANGEMENT WITH MULTIPLE SOURCES

(75) Inventors: Harm J. W. Belt, Eindhoven (NL);
Cornelis P. Janse, Eindhoven (NL)

(73) Assignee: Koninklijke Philips Electronics N.V., Eindhoven (NL)

(\*) Notice: Subject to any disclaimer, the term of this patent is extended or adjusted under 35 U.S.C. 154(b) by 0 days.

This patent is subject to a terminal disclaimer.

(21) Appl. No.: 09/196,064

(22) Filed: Nov. 19, 1998

(30) Foreign Application Priority Data

Nov. 22, 1997 (EP) .................................. 97203658

(51) Int. Cl.
*G06F 155/00* (2006.01)
(52) U.S. Cl. ....................................................... 381/92
(58) Field of Classification Search ............ 381/91–92, 381/102, 104, 109, 111, 122, 119, 94.1–94.3, 381/83.93, 61–63, 66, 120, 107; 379/406.01–406.16; 604/127
See application file for complete search history.

(56) References Cited

U.S. PATENT DOCUMENTS

| | | | | |
|---|---|---|---|---|
| 4,536,887 A | * | 8/1985 | Kaneda et al. | 381/92 |
| 4,696,043 A | * | 9/1987 | Iwahara et al. | 381/92 |
| 5,058,170 A | * | 10/1991 | Kanamori et al. | 381/92 |
| 5,208,864 A | * | 5/1993 | Kaneda | 704/258 |
| 5,323,459 A | * | 6/1994 | Hirano | 379/391 |
| 5,353,376 A | * | 10/1994 | Oh et al. | 395/2.42 |
| 5,602,962 A | * | 2/1997 | Kellermann | 381/92 |
| 5,610,991 A | * | 3/1997 | Janse | 381/92 |
| 5,657,393 A | * | 8/1997 | Crow | 381/92 |
| 5,774,562 A | * | 6/1998 | Furuya et al. | 381/66 |
| 5,872,852 A | * | 2/1999 | Dougherty | 381/57 |
| 6,137,887 A | * | 10/2000 | Anderson | 381/92 |
| 6,774,934 B1 | * | 8/2004 | Belt et al. | 348/211.1 |

OTHER PUBLICATIONS

By S. Affes and Y. Grenier "A Signal Subspace Tracking Algorithm for Microphone Array Processing of Speech" in IEEE Transactions on Speech and Audio Processing, vol. 5, No. 5, Sep. 1997, pp. 425-437.

A. Affes et al., "A Signal Subspace Tracking Algorithm for Microphone Array Processing of Speech", IEEE Transactions of Speech and Audio Processing, vol. 5, No. 5, Sep. 1997.

\* cited by examiner

*Primary Examiner*—Vivian Chin
*Assistant Examiner*—Lao Lun-See

(57) ABSTRACT

In an audio processing arrangement (2) input signals from a plurality of input sources (4,6) are weighted by weighting factors x and y using weighting elements (10, 12). The weighted input signals are combined to a combined signal by an adder (18). The output signal of the adder (18) constitutes the output of the audio processing arrangement.

Figure 1:
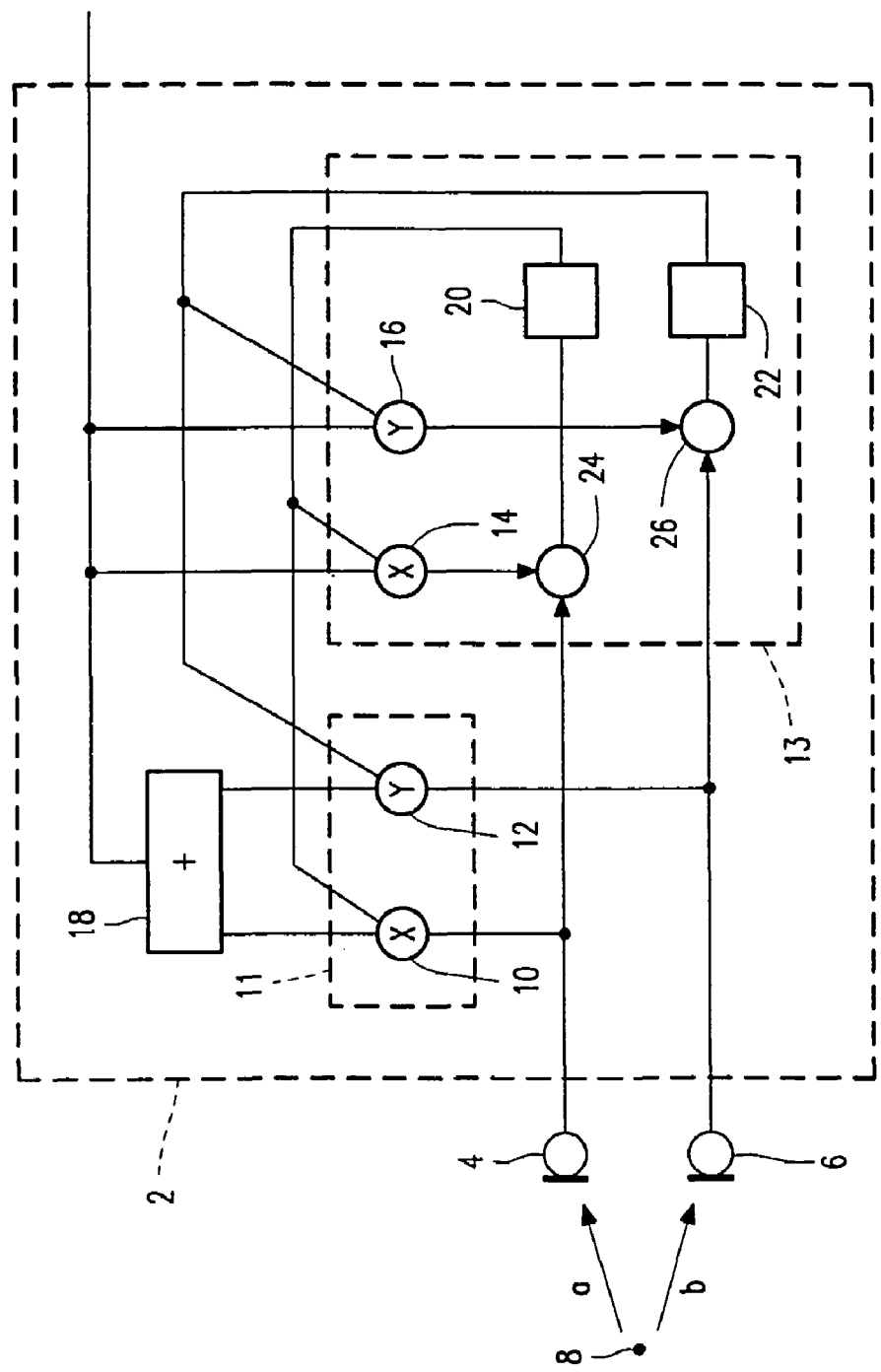

In order to pronounce the signal with the strongest signal, the weighting coefficients (x,y) are controlled to maximize the output signal of the adder (18) under the constraint that the sum of the squares of the weighting coefficients is equal to a constant.

11 Claims, 9 Drawing Sheets

AUDIO PROCESSING ARRANGEMENT WITH MULTIPLE SOURCES

The present invention is related to an audio processing arrangement comprising a plurality of audio sources generating input audio signals, processing means for deriving processed audio signals from the input audio signals, the audio processing arrangement comprising combining means for deriving a combined audio signal from the processed audio signals.

The present invention is also related to an audio signal processing arrangement and to an audio processing method.

An audio processing according to the invention is known from the article "A Signal Subspace Tracking Algorithm for Microphone Array Processing of Speech" by S. Affes and Y. Grenier in IEEE Transactions on Speech and Audio Processing, Vol. 5, No. 5, September 1997.

In current and future communication systems like mobile telephony, video conferencing and Internet (TCP/IP) based communication, hands free operation becomes of increasing importance. Also in user interfaces that use speech recognition hands free operation plays an important role.

One acoustic phenomenon which degrades speech intelligibility is reverberation due to the multipath propagation from the speaker to the microphone. This multipath propagation is caused by reflection of the speech signals against surrounding of the speaker, such as walls, furniture etc. In order to deal with this multipath propagation often a so-called Delay-Sum beamformer is used. In a Delay-Sum beamformer signals from a plurality of microphones are subjected to a delay value in order to compensate the delay differences between the speaker and the respective microphones. The delayed signals are combined by adding them. If the delay compensation works perfectly, the direct field components of the delay compensated audio signals will add coherently, while the reverberant speech components add incoherently. This will result in an increase of the speech intelligibility.

A problem with the Delay-Sum beamformer is that it is very difficult to determine the delay values accurately and fast enough to track a moving speaker or to adapt to another person who starts to speak. This is in particular the case in reverberant rooms. As a result, the delay estimates may be wrong and the microphone signals are no longer added coherently. Consequently, no improvement of the intelligibility of the speech signal is obtained. It may even happen that the speech intelligibility degrades.

In the above mentioned article a method is described for improving the performance of the intelligibility of the speech signal. In said article use is made of an energy transfer function from the speaker to the microphones under the assumption that this energy transfer function will not change significantly if the speaker moves. The above mentioned energy transfer function has to be determined by measurements. Requiring measurements for each site, makes the deployment of products using this method quite cumbersome.

The object of the present invention is to provide an audio processing arrangement in which no measurements have to be performed before deployment of the audio processing arrangement.

To achieve this objective the audio processing arrangement according to the invention is characterized in that the audio processing arrangement comprises control means for controlling the processing means in order to maximize a power measure of the combined audio signal, and in that the control means are arranged for limiting a combined power gain measure of the processed audio signals to a predetermined value.

By maximizing a power measure of the combined audio signal under the constraint that a combined power gain measure (e.g. the sum of the power of the individual signals) is limited to a predetermined value, no use of measured data has to be made. Experiments have shown that the intelligibility of the speech signal is not deteriorated with respect to the prior art arrangement.

Experiments have also shown that in the prior art arrangement so-called pre-echoes occur when filters having a long impulse response are used. Pre-echoes occur when before the reproduction of the direct field component of the speech signal, a scaled version thereof is reproduced. The occurrence of pre-echoes is regarded as quite annoying by a listener. Experiments have also shown that in the processing arrangement according to the invention the occurrence of pre-echoes is substantially less than in the processing arrangement according to the prior art.

An embodiment of the invention is characterized in that the processing means comprise scaling means for scaling the input audio signals with a scaling factor for obtaining the processed audio signal, said control means comprise further scaling means for deriving a plurality of scaled combined audio signals with a scaling factor corresponding to the scaling factor of the scaling means, and in that the control means are arranged for maximizing a power measure of the combined audio signal, and for limiting a combined power gain measure of the processed audio signals by minimizing a difference between the input audio signals and the scaled combined audio signals corresponding to said audio signals.

Experiments have shown that using a simple scaling factor as processing means a very substantial improvement of the intelligibility can be obtained. A suitable constraint is now that the sum of squares of the scaling factors for the different input sources is equal to a predetermined constant.

A further embodiment of the present invention is characterized in that the processing means comprise a plurality of adjustable filters for deriving the processed audio signal, in that the control means comprise a plurality of further adjustable filters having a transfer function being the conjugate of the transfer function of the adjustable filters, said further adjustable filters being arranged for deriving from the combined audio signal filtered combined audio signals, and in that the control means are arranged for maximizing the power measure of the combined audio signal, and for restricting a combined power gain measure of the processed audio signals to a predetermined value by controlling the transfer functions of the adjustable filters and the further adjustable filters in order to minimize a difference measure between the input audio signals and the filtered combined audio signal corresponding to said input audio signals.

By using adjustable filters as processing means the quality of the speech signal can be further enhanced. By minimizing a difference measure between the input audio signal and the corresponding filtered combined audio signal, it is obtained that a power measure of the combined audio signal is maximized under the constraint that per frequency component the sum of the power gains of the adjustable filters is equal to a predetermined constant. The correspondence between the two criteria mentioned above will be shown in the detailed description of the drawings by using a simplified example.

The use of adjustable filters makes that no adjustable delay elements such as used in a sum-delay beamformer are required.

A further embodiment of the invention is characterized in that the audio sources comprise a plurality of microphones, and in that the microphones are placed in a position such that their directionality patterns are substantially disjunct.

By combining a plurality of microphones having disjunct directionality patterns, with the combining arrangement according to the invention it is obtained that the signal from the microphone receiving the strongest speech signal is emphasized automatically. Such a system can be advantageously be used in a conference system in which the sound produced by a speaking person has to be emphasized, without needing a switch which is able to select the microphone with the strongest signal.

A still further embodiment of the invention is characterized in that the audio sources comprise a plurality of microphones being placed in a linear array.

Experiments have shown when a linear array of microphones is used as audio source in combination with adjustable filters in the processing means, the speech signals and their first reflections are added coherently, resulting in an improvement of the speech intelligibility. This configuration turned out to be more robust and showed a much faster convergence than configuration using a sum-delay beamformer. It is observed that in the linear array the microphones are placed on a line substantially orthogonal to the direction of the main lobe of the directionality pattern, but that it is also possible that the microphones are placed on a line coinciding with the direction of the main lobe of the directionality pattern.

Figure 2A:
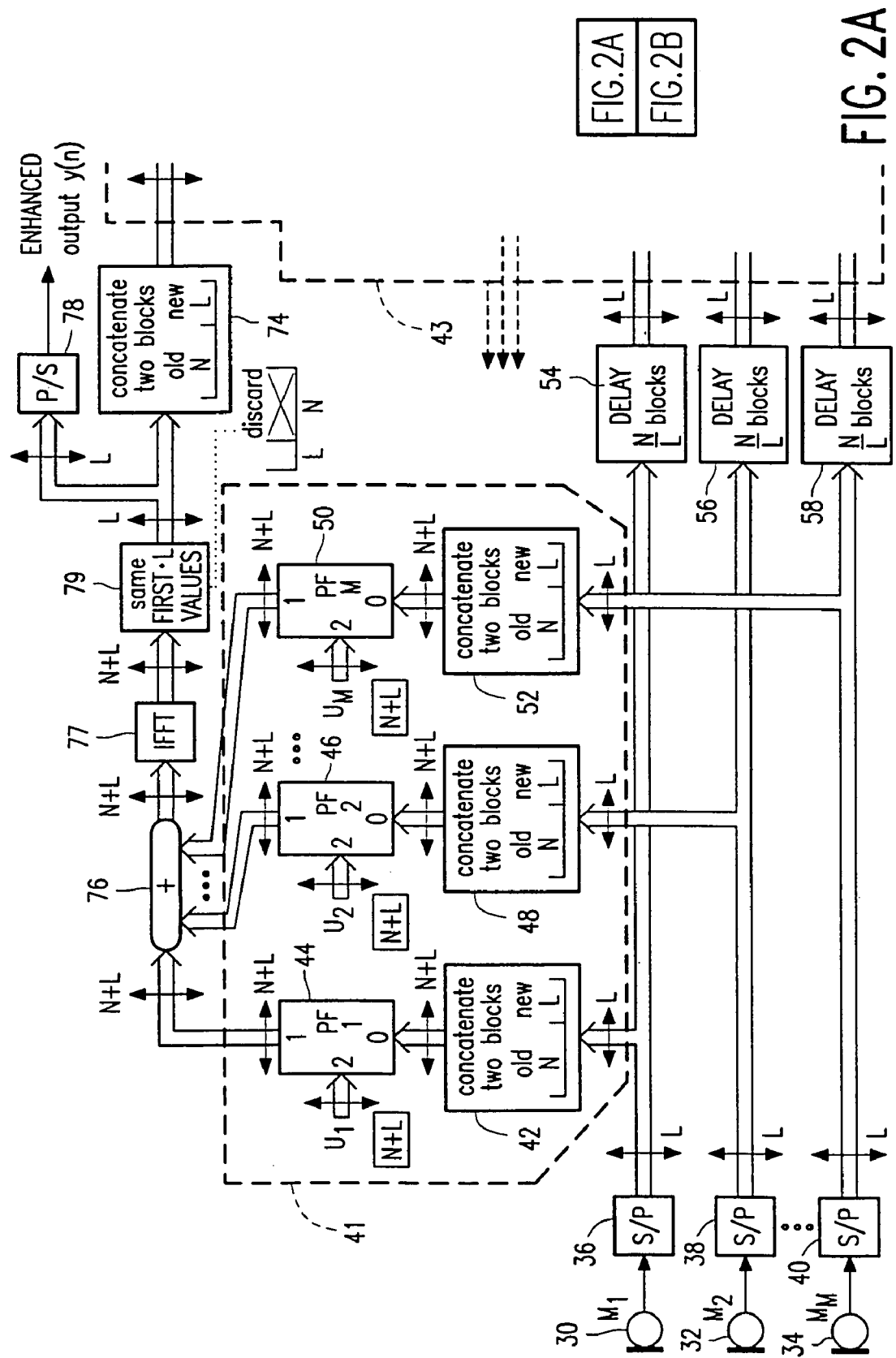
Figure 2B:
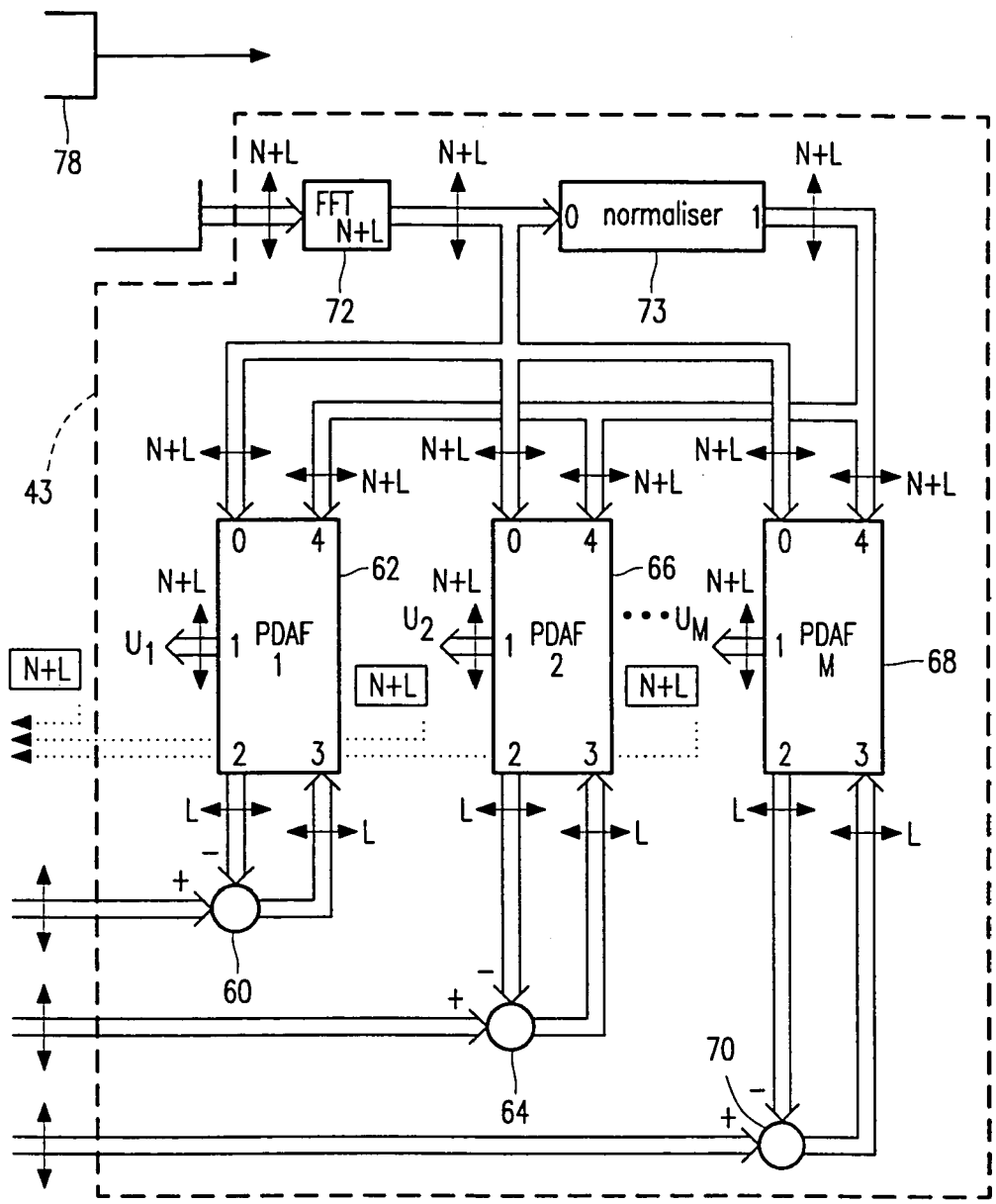
Figure 3:
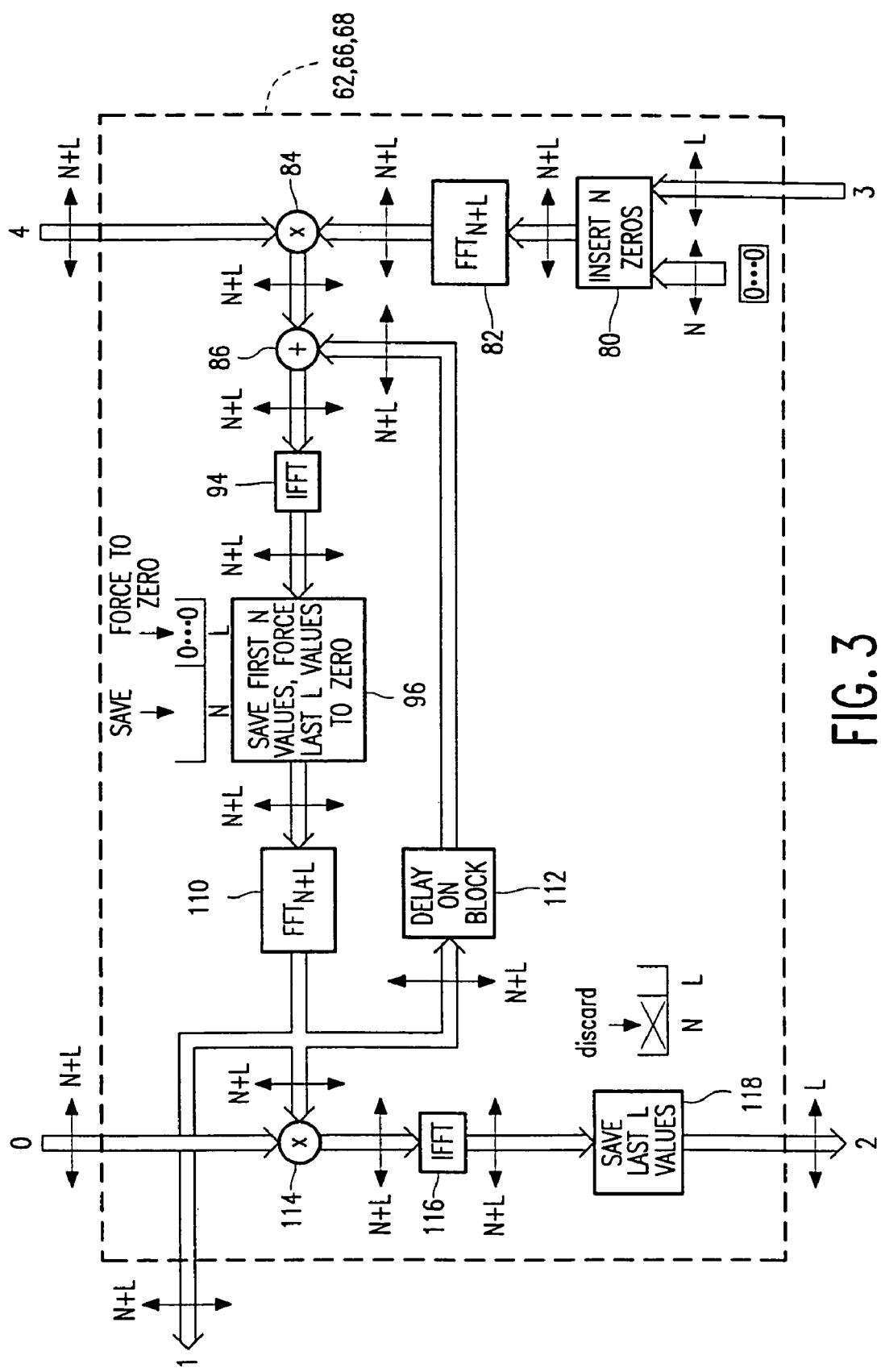

The invention will now be explained with reference to the drawings. Herein shows:

FIG. 1 an audio processing arrangement according to the invention in which real valued weighting factors are used in the processing means;

FIG. 2 an audio processing arrangement according to the invention in which frequency domain adaptive and frequency domain programmable filters are used;

FIG. 3, a detailed embodiment of the normalization means 73 used in the arrangement according to FIG. 2.

Figure 4:
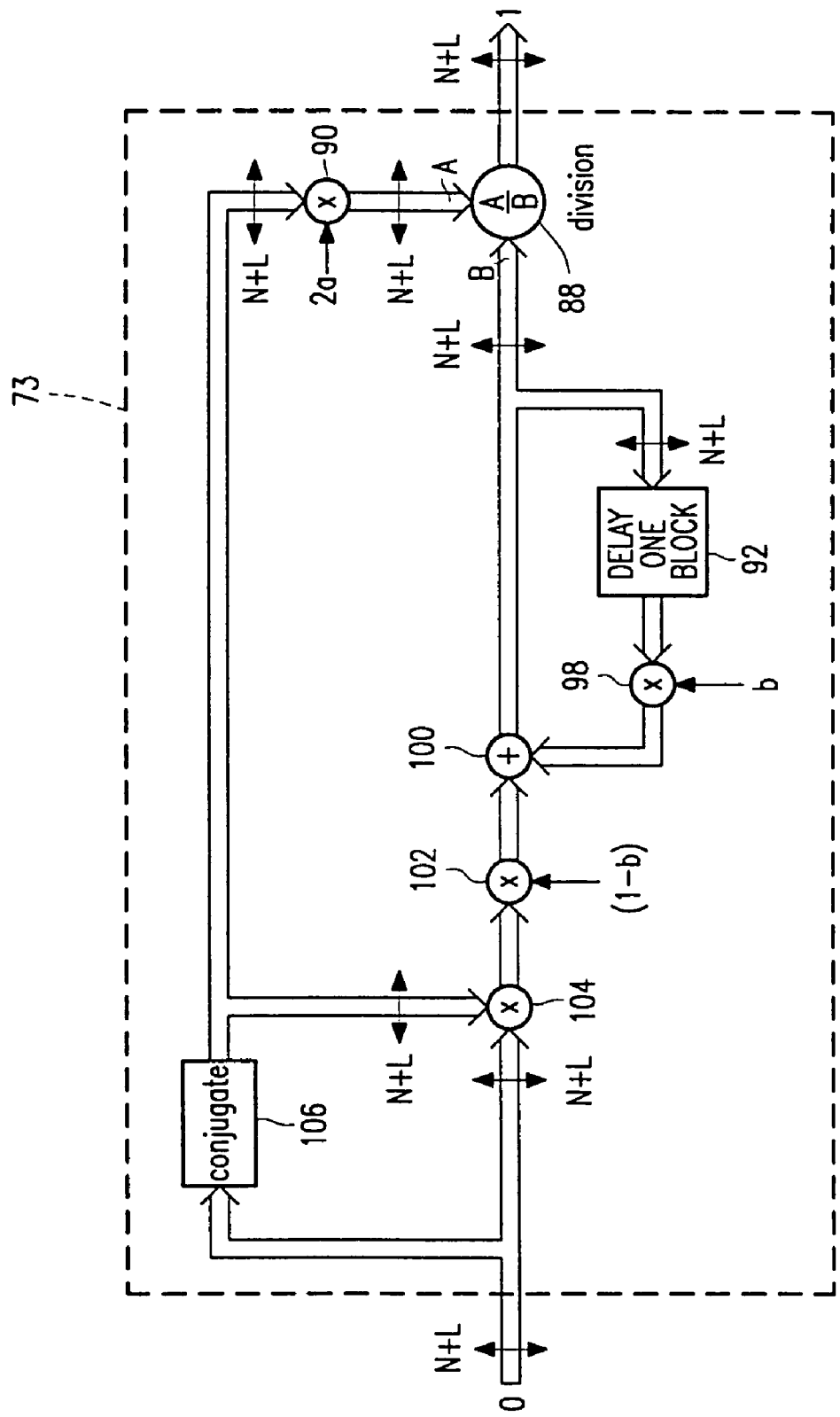
Figure 5:
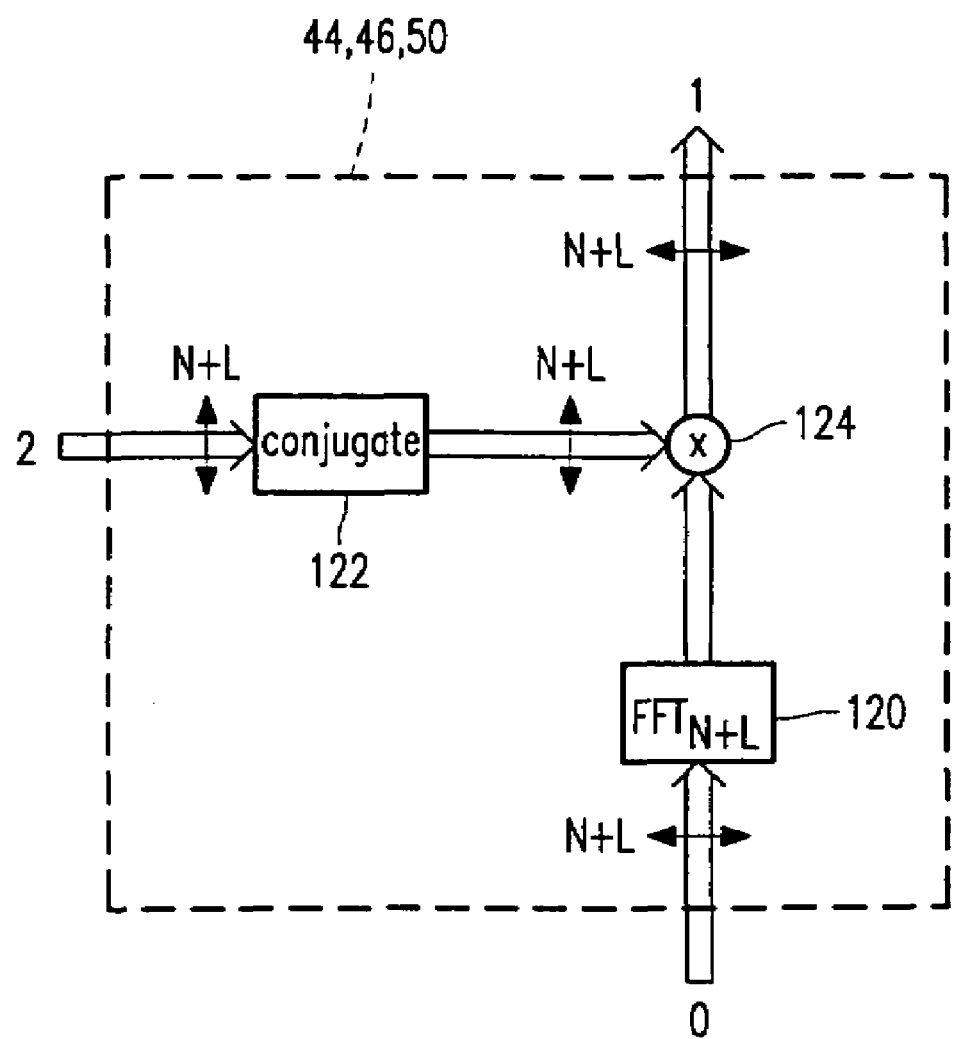
Figure 6A:
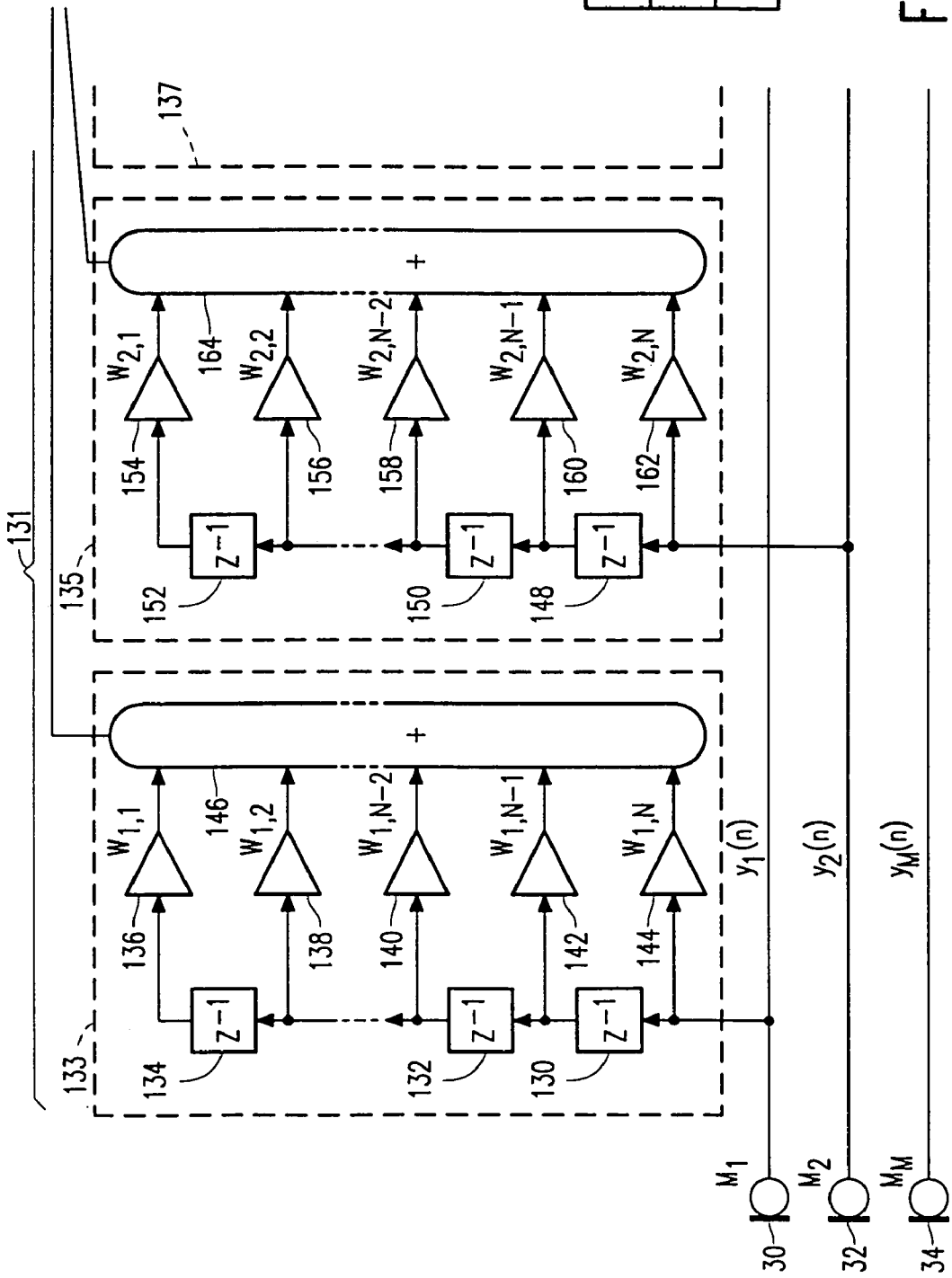
Figure 6B:
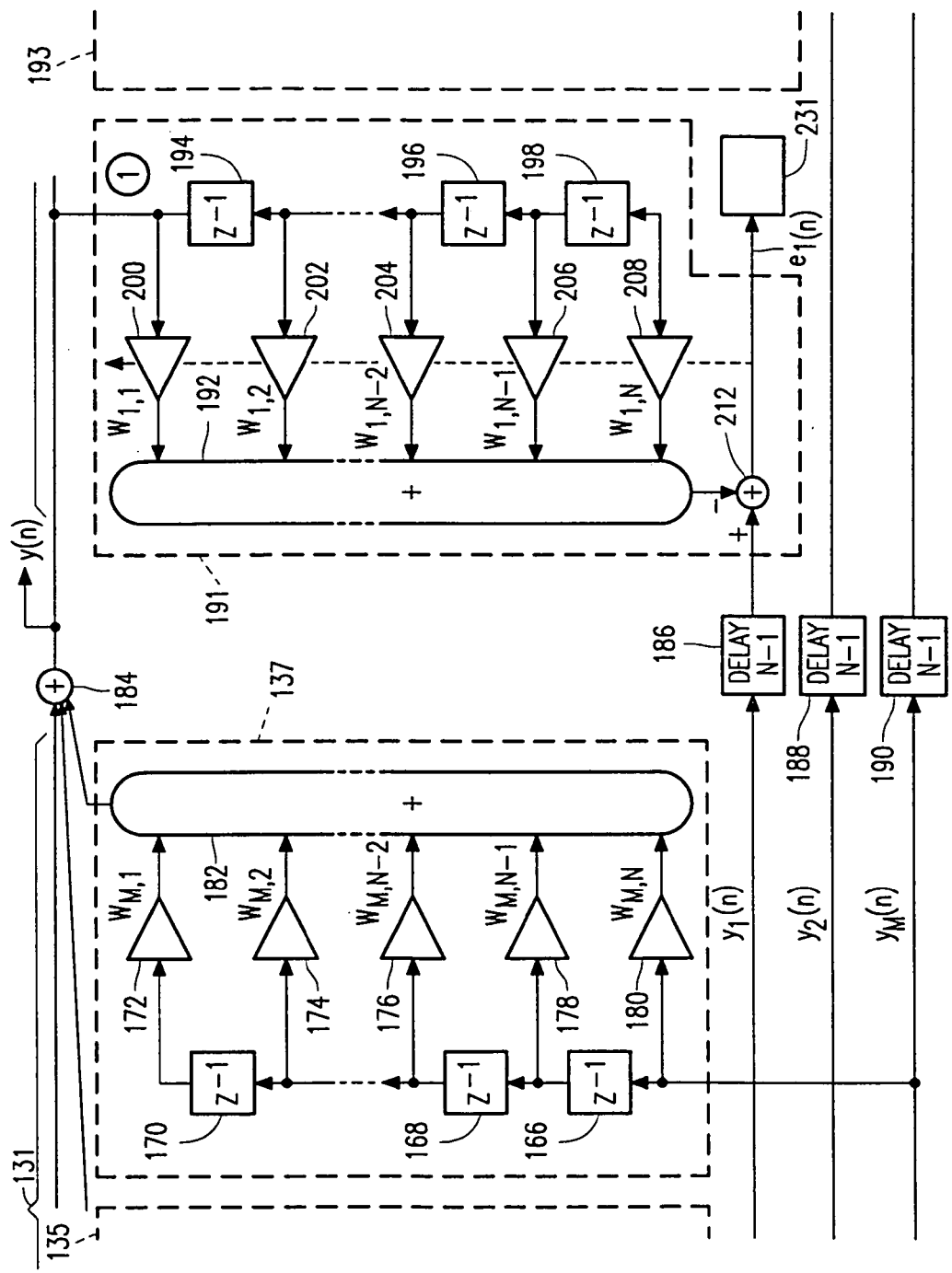
Figure 6C:
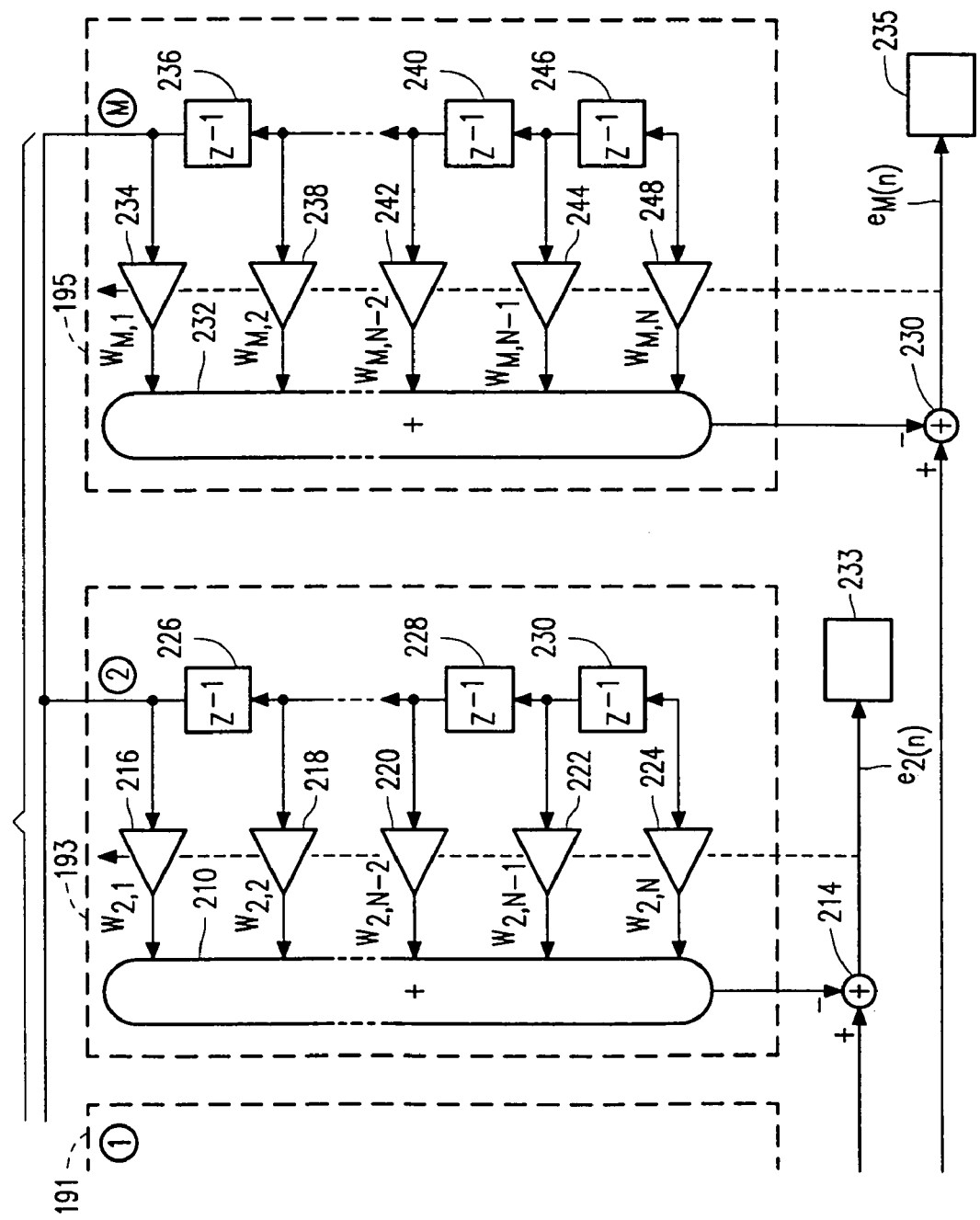

FIG. 4 an implementation of the frequency domain adaptive filters 62, 66 and 68 used in FIG. 2;

FIG. 5 an implementation of the frequency domain programmable filters 44, 46 and 50 used in FIG. 2;

FIG. 6 an implementation of the audio processing arrangement according to the invention in which time domain adaptive filters and time domain programmable filters are used.

In the audio processing arrangement 2 according to FIG. 1, an output of a first audio source, being here a microphone 4, is connected to a first input of the audio processing arrangement 2 and an output of a second audio source, being here a microphone 6, is connected to a second input of the audio processing arrangement 2. If it is assumed that the microphones 4 and 6 receive a signal $V_{IN}$ via attenuation factors a and b, the output signal of microphone 4 is equal to $a \cdot V_{IN}$ and the output signal of microphone 6 is equal to $b \cdot V_{IN}$. The processing means comprise here first scaling means 10 and second scaling means 12 which scale their input signals with a scaling factor x respectively y. At the output of the processing means 11 the processed signals $V_P$ and $V_Q$ are available. For these processed signals can be written:

$$V_P = a \cdot x \cdot V_{IN} \quad (A)$$

and $$V_Q = b \cdot y \cdot V_{IN} \quad (B)$$

At the output of the combination means 18 the sum $V_{SUM}$ of the processed signals $V_P$ and $V_Q$ is available. This signal $V_{SUM}$ is equal to:

$$V_{SUM} = (a \cdot x + b \cdot y) V_{IN} \quad (C)$$

The further scaling means 14 and 16 derive scaled combined signals from the combined signal using scaling factors x and y. The first scaled combined signal is equal to $$V_{SC1} = (a \cdot x + b \cdot y) \cdot x \cdot V_{IN} \quad (D)$$

and the second scaled combined signal is equal to:

$$V_{SC2} = (a \cdot x + b \cdot y) \cdot y \cdot V_{IN} \quad (E)$$

A first difference measure between the first input audio signal and the first scaled combined audio signal is determined by a subtractor 24. For the output signal of the subtractor 24 can be written:

$$V_{DIFF1} = \{a - (a \cdot x + b \cdot y) \cdot x\} \cdot V_{IN} \quad (F)$$

A second difference measure between the second input audio signal and the second scaled combined audio signal is determined by a subtractor 26. For the output signal of the subtractor 26 can be written:

$$V_{DIFF2} = \{b - (a \cdot x + b \cdot y) \cdot y\} \cdot V_{IN} \quad (G)$$

The arrangement according to FIG. 1 comprises a control element 20 for adjusting the scaling factor x to make the output signal of $V_{DIFF1}$ of the subtractor 24 equal to 0. The arrangement further comprises a control element 22 to make the output signal $V_{DIFF2}$ of the subtractor 26 equal to 0. In order to find the values for x and y to make both difference signals equal to 0, the following set of equations has to be solved:

$$(a \cdot x + b \cdot y) \cdot x = a \quad (H)$$

$$(a \cdot x + b \cdot y) \cdot y = b \quad (I)$$

Eliminating the term (a·x+b·y) from (8) and (9) by dividing (8) by (9) results in:

$$\frac{x}{y} = \frac{a}{b} \Rightarrow x = \frac{a \cdot y}{b} \quad (J)$$

Substituting (10) in (9) gives the following expression in y:

$$\left(\frac{a^2 \cdot y}{b} + b \cdot y\right) \cdot y = b \Rightarrow y = \frac{\pm b}{\sqrt{a^2 + b^2}} \quad (K)$$

Substituting (11) into (10) gives for x:

$$x = \frac{\pm a}{\sqrt{a^2 + b^2}} \quad (L)$$

From (11) and (12) it is clear that the value of x increases when a increases (or b decreases) and that the value of y increases when b increases (or a decreases). In such a way the strongest input signal is pronounced. This is of use to enhance a speech signal of a speaker over background noise and reverberant components of the speech signal without needing to know the frequency dependence of the path a and b from the speaker to the microphones as was needed in the prior art arrangement. An estimate of the values a and b can be derived from an average level of the input signals of the microphone.

Below will be demonstrated that maximizing the power of the combined audio signal under the constraint that the sum of the power gains of the processing means is limited, results in the same values for x and y as making the output signals of the subtractors 24 and 26 equal to 0.

For the power measure $P_{SUM}$ of the combined audio signal $V_{SUM}$ can be written:

$$P_{SUM} = V_{SUM}^2 = (a \cdot x + b \cdot y)^2 \cdot V_{IN}^2 \quad \text{(M)}$$

For the boundary condition that the sum of the power gains of the scaling means is limited to a constant value can be stated:

$$G^P = x^2 + y^2 = 1 \quad \text{(N)}$$

Consequently, the term $(a \cdot x + b \cdot y)^2$ has to be maximized under the boundary condition $x^2 + y^2 - 1 = 0$. This can be done by using the well known Lagrange multiplier method. According to said method, the following expression has to be maximized:

$$(a \cdot x + b \cdot y)^2 + \lambda \cdot (x^2 + y^2 - 1) \quad \text{(O)}$$

Differentiating (15) with respect to x and y and setting the derivatives to zero gives:

$$2 \cdot (a \cdot x + b \cdot y) \cdot a + 2 \cdot x = 0 \quad \text{(P)}$$

$$2 \cdot (a \cdot x + b \cdot y) \cdot b + 2 \cdot \lambda \cdot y = 0 \quad \text{(Q)}$$

By multiplying (16) with y and multiplying (17) with x and subtracting the results, yields:

$$y = \frac{b}{a} \cdot x \quad \text{(R)}$$

Substituting (18) in (14) gives for x and y:

$$x = \frac{\pm a}{\sqrt{a^2 + b^2}}; \quad y = \frac{\pm b}{\sqrt{a^2 + b^2}} \quad \text{(S)}$$

These results correspond to (11) and (12). Consequently it is clear that controlling x and y to make the difference signals equal to 0 is equivalent to maximizing the power of the combined signal under the boundary condition that the sum of the power gains of the different branches of the processing means is limited to a maximum value.

The above can easily be generalized for N input signals each having a transfer factor $a_i$ with $1 \leq i \leq N$. If it assumed that the processing means have N branches each corresponding to a signal i and having a transfer factor $x_i$, for these values of $x_i$ can be written:

$$x_i = \frac{\pm a_i}{\sqrt{\sum_{j=1}^{N} a_j^2}} \quad \text{(T)}$$

The arrangement according to FIG. 1 can be combined with delay elements to compensate differences in the path delays from the source of the audio signal and the several microphones. The arrangement according to the invention gives an improved performance, also during transition periods in which the delay value of the delay elements to compensate the path delays are not yet adjusted to their optimum value.

In the audio processing arrangement according to FIG. 2, input signals from audio sources being here microphones 30, 32 and 34 are converted into digital signals which are converted into block of L samples by respective series to parallel converters 36, 38 and 40. The output of the series to parallel converters 36, 38 and 40 are connected to corresponding inputs of the processing means 41, and to input of respective block delay elements 54, 56 and 58.

In the processing means 41 the output signal of the series to parallel converter 36 is applied to a block concatenation unit 42. The block concatenating unit 42 constructs blocks of N+L samples from the present block of L samples and N samples from previous blocks of samples available at the output of the series to parallel converter 36. The output of the block concatenation unit 42 is connected to an input of a frequency domain programmable filter 44. The output of the frequency domain programmable filter 44, carrying a processed audio signal, is connected to a first input of the combining means being here an adder 76. The frequency domain programmable filter 44 presents blocks of N+L samples at its output.

In the same way the output signal of the series to parallel converter 38 is processed by a block concatenating unit 48 and a frequency domain programmable filter 46 and the output signal of the series to parallel converter 40 is processed by a block concatenating unit 52 and a frequency domain programmable filter 50. Outputs of the frequency domain programmable filters 46 and 50, carrying processed audio signals, are connected to corresponding inputs of the adder 76.

The output of the adder 76 is connected to an input of an IFFT unit 77 which determines an Inverse Fast Fourier Transformed signal from the output signal of the adder 76. The output of the IFFT unit 77 is connected to an input of a unit 79 which discards N samples of the N+L samples at the output of the IFFT unit 77.

The output signal of the unit 77 is converted into a serial stream of samples by the parallel to series converter 78. At the output of the parallel to series converter 78 the output signal of the audio processing arrangement is available. The output signal of the unit 79 is also applied to a block concatenating unit 74 which derives blocks of N+L samples from the present block of L samples at the output of the adder 76 and a block of N previous samples at the output of the unit 79. The output of the block concatenating unit 74 is connected to an input of an Fast Fourier Transformer 72 which calculates a N+L points FFT from the N+L samples at its input. The output signal of the Fast Fourier Transformer 72 represents the frequency spectrum of the combined signal. This frequency spectrum is applied to inputs of frequency domain adaptive filters 62, 66 and 68, and to an input of a normalizer 73. An output of the normalizer 73 is connected to inputs of the frequency domain adaptive filters 62, 66 and 68.

The output of the block delay element 54 is connected to a first input of a subtractor 60. The output of the block delay element 56 is connected to a first input of a subtractor 64 and the output of the block delay element 58 is connected to a first input of a subtractor 70. The block delay elements 54, 56 and 58 are present to compensate the delay to which the audio signals are subjected in the frequency domain programmable filters 44, 46 and 50 and in the frequency domain adaptive filters 62, 66 and 68.

An output of the frequency domain adaptive filter 62 is connected to a second input of the subtractor 60 and the output of the subtractor 60 is connected to a control input of the frequency domain adaptive filter. An output of the frequency domain adaptive filter 66 is connected to a second input of the subtractor 64 and the output of the subtractor 64 is connected to a control input of the frequency domain adaptive filter. An output of the frequency domain adaptive filter 68 is connected to a second input of the subtractor 70 and the output of the subtractor 70 is connected to a control input of the frequency domain adaptive filter.

The frequency domain adaptive filters 62, 66 and 68 are arranged to adjust their transfer function in order to minimize the power of the input signal at their control inputs. The frequency domain adaptive filters 62, 66 and 68 provide their N+L filter coefficients to the frequency domain programmable filters 44, 46 and 48. These frequency domain adaptive filters determine the conjugate value of the N+L filter coefficients before using them to filter the signals received from the block concatenating units 42, 48 and 52.

In the frequency domain adaptive filters 62, 66 and 68 according to FIG. 3, a padding element 80 combines the L samples available at the control input of the respective frequency domain adaptive filter with N samples having a value of 0 to a block of data having N+L samples. This block of N+L samples is subjected to a N+L points Fast Fourier Transform executed by a FFT element 82. The extension of blocks of L samples to blocks of N+L samples before executing the FFT is done to prevent distortion of the signal due to the symmetry of the FFT signal around half the sampling frequency. This measure is well known to those skilled in the art of frequency domain (adaptive) filters.

At the output of the FFT element 82 the frequency spectrum of the signal at the control input of the frequency domain adaptive filter(=the output of the subtractor 60, 64 and 70 respectively) is available. The output signal of the FFT element 82 is multiplied with the output signal of the normalizer 73. The N+L components of the output signal of the normalizer 73 represents adaptation speed values determining the speed of adaptation of the coefficients of the frequency domain adaptive filter.

The output signal of the multiplier 84 is added to the output signal of the block delay element 112. The output signal of the block delay element 112 represents the previous values of the filter coefficients of the frequency domain adaptive filter. The output signal of the adder 86 is subjected to an Inverse Fast Fourier Transform executed by an IFFT element 94. From the 2·L output samples of the IFFT element 94, the value of the final L block is set to zero by the element 96. Subsequently the 2·L samples (of which L samples are zero) are subjected to an FFT operation executed by an FFT element 110. The combination of the IFFT element 94, the element 96 and the FFT element 110 is present in order to avoid signal distortion due to the cyclic character of the FFT transform performed by the FFT processor 82.

At the output of the FFT element 110 N+L coefficients are available for use in the filter operation. These coefficients are also passed to the corresponding programmable filter. The filter coefficients are also passed to the output of the adder 86 via a block delay element 112. The combination of the adder 86, the IFFT element 94, the element 96, the FFT element 110 and the block delay element 112 determine the filter coefficient according to the following expression.

$$v_{i,k} = V_{i,k-1} + \lambda_{i,k} \cdot E_{k,i} \tag{U}$$

In (21) $v_{i,k}$ represents the N+L filter coefficients at instant k, $v_{i,k-1}$ represents the N+L filter coefficients at instant k−1, $\lambda_{i,k}$ represents the adaptation coefficients provided by the normalizer 73 to the second input of the multiplier 84 and $E_{k,i}$ represents the frequency spectrum of the error signal at the output of the subtractor 60, 64 or 70 in FIG. 2.

In the normalizer 73 according to FIG. 4, the input signal provided by the FFT unit 72 in FIG. 2 a conjugating element 106 determines the conjugate value of said input signal. This conjugate value is multiplied with said input signal by a multiplier 104. At the output of the multiplier 104 the power spectrum of the input signal is available. The output of the multiplier 104 is connected to an input of a multiplier 102.

A low pass filter constituted by the multiplier 102, an adder 100, a multiplier 98 and a block delay element 92 determines a time average of the power spectrum of the input signal of the frequency domain adaptive filter as available at the output of the multiplier 104. A suitable value for b is:

$$b = 1 - \frac{20 \cdot L}{f_{sample}} \tag{V}$$

In (22) $f_{sample}$ is the sample frequency with which the audio signals are sampled and processed. A value of 32 for L has proven to be a useful value. The output of the adder 100 carrying the time averaged power spectrum is connected to a first input of a divider 88. The output signal of the conjugating element 106 is scaled with a scaling factor 2a by a scaling element 90. A suitable value for a is 0.01. The output signal of the scaling element 90 is connected to a second input of the divider 88.

The divider 88 determines the values of $\lambda_{i,k}$ by calculating the ratio of the conjugated FFT transform (scaled with scaling factor 2a) of the input signal of the digital filter and the time averaged power spectrum of the input signal of the normalizer 73. The value of $\lambda_{i,k}$ increases proportional to the ratio between the $k^{th}$ component of the spectrum of the input signal and the $k^{th}$ component of the time averaged power spectrum. This results an adaptation speech which is the same for all frequency components irrespective of their strength.

In the frequency domain programmable filter 44, 46 and 50 according to FIG. 5, the input signal is applied to the input of an FFT element 120 which calculates a N+L points FFT from said input signal. A conjugating element 122 determines the conjugate value of the parameters received from the frequency domain adaptive filters 62, 66, 68. A multiplier 124 calculates a filtered signal by multiplying the FFT of the input signal with the conjugated filter coefficients received from the frequency domain adaptive filters.

An IFFT element 126 calculates a time domain output signal from the filtered output signal available at the output of the multiplier 124. A discarding element discards the L last samples from the output signal of the IFFT element 126 and presents at its output the output signal of the frequency domain programmable filter.

It is observed that a suitable choice for N is making it equal to L, but it is also possible to choose N smaller or larger than L. It is desirable to make N+L equal to a power of two in order to enable an easy implementation of the FFT and IFFT operations.

In the time domain implementation of the audio processing arrangement according to FIG. 6 the outputs of microphones 30, 32 and 34 are connected to inputs of processing means 131 and to delay elements 186, 188 and 190. The processing means 131 comprise time domain programmable filters 133, 135 and 137.

The time domain programmable filter 133 comprises a plurality of cascaded delay elements 130, 132 and 134, and an adder 146 which adds the output signals of the delay elements weighted with a weighting factor $W_{1,1} \ldots W_{1,N}$. The weighting is performed by the weighting elements 136, 138, 140, 142 and 144. The time domain programmable filter 135 comprises a plurality of cascaded delay elements 148, 150 and 152, and an adder 164 which adds the output signals of the delay elements weighted with a weighting factor $W_{2,1} \ldots W_{2,N}$. The weighting is performed by the weighting elements 154, 156, 158, 160 and 162. The time domain programmable filter 137 comprises a plurality of cascaded delay elements 166, 168 and 170, and an adder 182 which adds the output signals of the delay elements weighted with a weighting factor $W_{M,1} \ldots W_{M,N}$.

The outputs of the time domain programmable filters 133, 135 and 137, carrying the processed audio signals, are connected to the combination means being here an adder 184. At the output of the adder 184 the enhanced audio signal is available. The output of the adder 184 is connected to inputs of time domain adaptive filters 191, 193 and 195.

The time domain adaptive filter 191 comprises a plurality of delay elements 194, 196 and 198. The output signals of the delay elements 194, 196 and 198 are weighted with weighting factors $W_{1,1} \ldots W_{1,N}$ by weighting elements 200, 202, 204, 206 and 208. The output signals of the weighting elements 200 . . . 208 are added by an adder 192 which provides the output signal of the adaptive filter 191.

The time domain adaptive filter 193 comprises a plurality of delay elements 226, 228 and 230. The output signals of the delay elements 226, 228 and 230 are weighted with weighting factors $W_{2,1} \ldots W_{2,N}$ by weighting elements 216, 218, 220, 222 and 224. The output signals of the weighting elements 216 . . . 224 are added by an adder 210 which provides the output signal of the adaptive filter 193.

The time domain adaptive filter 195 comprises a plurality of delay elements 236, 240 and 246. The output signals of the delay elements 236, 240 and 246 are weighted with weighting factors $W_{M,1} \ldots W_{M,N}$ by weighting elements 234, 238, 242, 244 and 248. The output signals of the weighting elements 234 . . . 248 are added by an adder 232 which provides the output signal of the time domain adaptive filter 195.

The outputs of the delay elements 186, 188 and 190 are connected to first inputs of subtractors 212, 214 and 250. The delay elements 186, 188 and 190 are present to make the impulse response of the programmable filters relatively anti-causal (earlier in time) with respect to the impulse response of the time domain programmable filters. Second inputs of the subtractors 212, 214 and 250 are coupled to outputs of the time domain adaptive filters 191, 193 and 195. The outputs of the subtractors 212, 214 and 250 are connected to control means 231, 233 and 235 respectively. The control means are arranged to adjust the transfer function of the corresponding adaptive filter 191, 193 and 195 in order to minimize the power of the output signal of the corresponding subtractor.

The control means 231, 233 and 235 are arranged for adjusting the coefficients of the adaptive filters 191, 193 and 195 according to the following expression:

$$W_{j,k}(n+1) = W_{j,k}(n) + \mu \cdot y[n-k] \cdot e_j[n] \qquad (w)$$

In (23) $W_{j,k}(n)$ is the weight factor of the $k^{th}$ weighting element in the $j^{th}$ adaptive filter, $\mu$ is a adaptation constant and $e_j[n]$ is the difference between the output signal of the $j^{th}$ block delay element delaying the input signal and the output signal of the $j^{th}$ adaptive filter. $y_j[n \cdot k]$ is the over k sample periods delayed output signal of the audio processing arrangement. These signals $y[n \cdot k]$ are available at the output of the delay elements of the adaptive filters. Because the adaptive filters all have the same input signals, the delay elements can be shared leading to a reduction of the required number of delay elements.

After the coefficients $W_{j,k}(n)$ have been determined, these coefficients are reversely passed to the time domain programmable filters 133, 135 and 137. This means that the coefficients corresponding to the first taps in the adaptive filters are passed to coefficients of the last taps in the corresponding programmable filter.

The invention claimed is:

1. An audio arrangement that utilizes an energy transfer function for delay compensation, said arrangement comprising:
    a plurality of audio sources generating a plurality of input audio signals;
    a processor comprising a scaling means for weighting the plurality of input signals and deriving a plurality of processed audio signals from the plurality of input audio signals without delay values;
    a combiner that derives a combined audio signal from the plurality of processed audio signals; and
    a controller that causes the processor to maximize a power measure of the combined audio signal, wherein the controller is arranged to limit a combined power gain measure of the processed audio signals to a predetermined value without measuring an energy transfer at each site where one respective audio source of the plurality of audio sources receives the input audio signals.

2. The audio processing arrangement according to claim 1, wherein the processor includes a scaling means for scaling the input audio signals with a scaling factor for obtaining the processed audio signal, said controller includes a further scaling means for deriving a plurality of scaled combined audio signals with a scaling factor corresponding to the scaling factor of the scaling means, and in that the controller is arranged for maximizing a power measure of the combined audio signal, and for limiting a combined power gain measure of the processed audio signals by minimizing a difference between the input audio signals and the scaled combined audio signals corresponding to said audio signals.

3. The audio processing arrangement according to claim 1, wherein the processor includes a plurality of adjustable filters for deriving the processed audio signal, in that the controller includes a plurality of further adjustable filters having a transfer function being the conjugate of the transfer function of the adjustable filters, said further adjustable filters being arranged for deriving from the combined audio signal filtered combined audio signals, and in that the contoller is arranged for maximizing the power measure of the combined audio signal, and for restricting a combined power gain measure of the processed audio signals to a predetermined value by controlling the transfer function of the adjustable filters and the further adjustable filters in order to minimize a difference measure between the input audio signals and the filtered combined audio signal corresponding to said input audio signals.

4. The audio processing arrangement according to claim 2, wherein the audio processing arrangement comprises a delay elements for compensating a delay difference of a common audio signal present in the input audio signals.

5. The audio processing arrangement according to claim 1, wherein the audio sources comprise a plurality of microphones, and in that the microphones are placed in a position such that their directionality patterns are substantially disjunct.

6. The audio processing arrangement according to claim 5, wherein the microphones are placed around a center position at angles being equal to 360 degrees divided by the number of microphones.

7. The audio processing arrangement according to claim 1 wherein the audio sources comprise a plurality of microphones being placed in a linear array.

8. The audio processing arrangement according to claim 1, further comprising a plurality of microphones having disjunct directionality patterns, wherein the audio signals are obtained from said plurality of microphones, and wherein the microphone receiving a strongest speech signal is automatically emphasized.

9. An audio signal processing arrangement that utilizes an energy transfer function for delay compensation, said arrangement comprising a plurality of inputs for receiving input audio signals, processing means for deriving processed audio signals including scaling means for scaling the input audio signals without delay values, the audio processing arrangement comprising combining means for deriving a combined audio signal from the processed audio signals, wherein the audio processing arrangement comprises a control means for controlling the processing means in order to maximize a power measure of the combined audio signal, and in that the control means are arranged for limiting a combined power gain measure of the processed audio signals to a predetermined value without measuring an energy transfer at each site where each respective one the plurality of audio sources receives the input audio signals.

10. An audio signal processing arrangement according to claim 9, wherein the scaling means scale the input audio signals with a scaling factor for obtaining the processed audio signals, said control means comprise further scaling means for deriving a plurality of scaled combined audio signals with a scaling factor corresponding to the scaling factor of the scaling means, and in that the control means are arranged for maximizing a power measure of the combined audio signal, and for limiting a combined power gain measure of the processed audio signals by minimizing a difference between the input signals and the scaled combined audio signals corresponding to said audio signals.

11. An audio processing method that utilizes an energy transfer function for delay compensation, said method comprising:
receiving a plurality of input audio signals from a plurality of audio sources;
deriving processed audio signals from the input audio signals that are scaled without delay values;
reducing reverberation by controlling the processing of the audio signals in order to maximize a power measure of a combined audio signal; and
controlling the processing for limiting a combined power gain measure of the processed audio signals to a predetermined value without measuring an energy transfer at each site where one respective audio source of the plurality of audio sources receives the input audio signals.

* * * * *